(12) United States Patent
Karayacoubian et al.

(10) Patent No.: US 12,342,497 B2
(45) Date of Patent: Jun. 24, 2025

(54) MODULAR COLD PLATE FOR ELECTRONIC CONTROL MODULE

(71) Applicant: Argo AI, LLC, Pittsburgh, PA (US)

(72) Inventors: Paul Karayacoubian, Cupertino, CA (US); Jonathan Michael Bonte, Farmington Hills, MI (US); Juan Aguayo, Dallas, TX (US); Rob Hibbs, Whitby (CA)

(73) Assignee: Ford Global Technologies, LLC, Dearborn, MI (US)

( * ) Notice: Subject to any disclaimer, the term of this patent is extended or adjusted under 35 U.S.C. 154(b) by 238 days.

(21) Appl. No.: 18/095,890

(22) Filed: Jan. 11, 2023

(65) Prior Publication Data
US 2024/0237275 A1 Jul. 11, 2024

(51) Int. Cl.
*H05K 7/20* (2006.01)
*B60R 16/023* (2006.01)

(52) U.S. Cl.
CPC ..... *H05K 7/20254* (2013.01); *H05K 7/20272* (2013.01); *H05K 7/2039* (2013.01); *B60R 16/0231* (2013.01)

(58) Field of Classification Search
CPC ........... H05K 7/20254; H05K 7/20272; H05K 7/2039; H05K 7/20872; B60R 16/0231
See application file for complete search history.

(56) References Cited

U.S. PATENT DOCUMENTS

| | | | |
|---|---|---|---|
| 10,481,652 B2 | 11/2019 | Rice et al. | |
| 10,905,031 B1 | 1/2021 | Gao | |
| 11,889,613 B1 * | 1/2024 | Castillo Orozco | G06F 1/20 |
| 2015/0131224 A1 * | 5/2015 | Barina | G06F 1/20 361/679.53 |
| 2015/0359132 A1 * | 12/2015 | Campbell | H05K 7/20236 361/700 |
| 2019/0045662 A1 * | 2/2019 | Schroeder | H05K 7/20263 |
| 2019/0196558 A1 | 6/2019 | Grossman et al. | |
| 2019/0281730 A1 * | 9/2019 | Gao | H05K 7/20781 |
| 2019/0387609 A1 * | 12/2019 | Chen | H01L 23/473 |
| 2021/0076539 A1 * | 3/2021 | Raeth | H05K 7/20254 |
| 2022/0053663 A1 * | 2/2022 | Adam | H05K 7/2039 |
| 2023/0025167 A1 * | 1/2023 | Gao | H05K 7/20254 |
| 2023/0204376 A1 * | 6/2023 | Fowe | G01C 21/3844 701/119 |
| 2024/0074101 A1 * | 2/2024 | Raeth | H05K 7/20772 |
| 2024/0164067 A1 * | 5/2024 | Rademacher | H05K 7/20854 |

* cited by examiner

*Primary Examiner* — Stephen S Sul
(74) *Attorney, Agent, or Firm* — Frank A. Mackenzie; Brooks Kushman P.C.

(57) ABSTRACT

Disclosed herein are embodiments for a control module cooling system. For example, the control module is provided with a chassis and a circuit board assembly that is mounted to the chassis and includes electronics that generate heat during operation. A cold plate is mounted to the chassis and adjacent to the circuit board assembly and defines an opening. A cold block is coupled to the cold plate and comprises: a base disposed within the opening and coupled to the electronics; a plurality of fins extending from the base and spaced apart from each other to form channels; and a plate that is spaced apart from the base to form a cavity. The plate defines an inlet that is arranged over a central portion of the plurality of fins to receive a liquid therethrough to facilitate impinging flow of the liquid through the channels to transfer heat from the electronics.

20 Claims, 8 Drawing Sheets

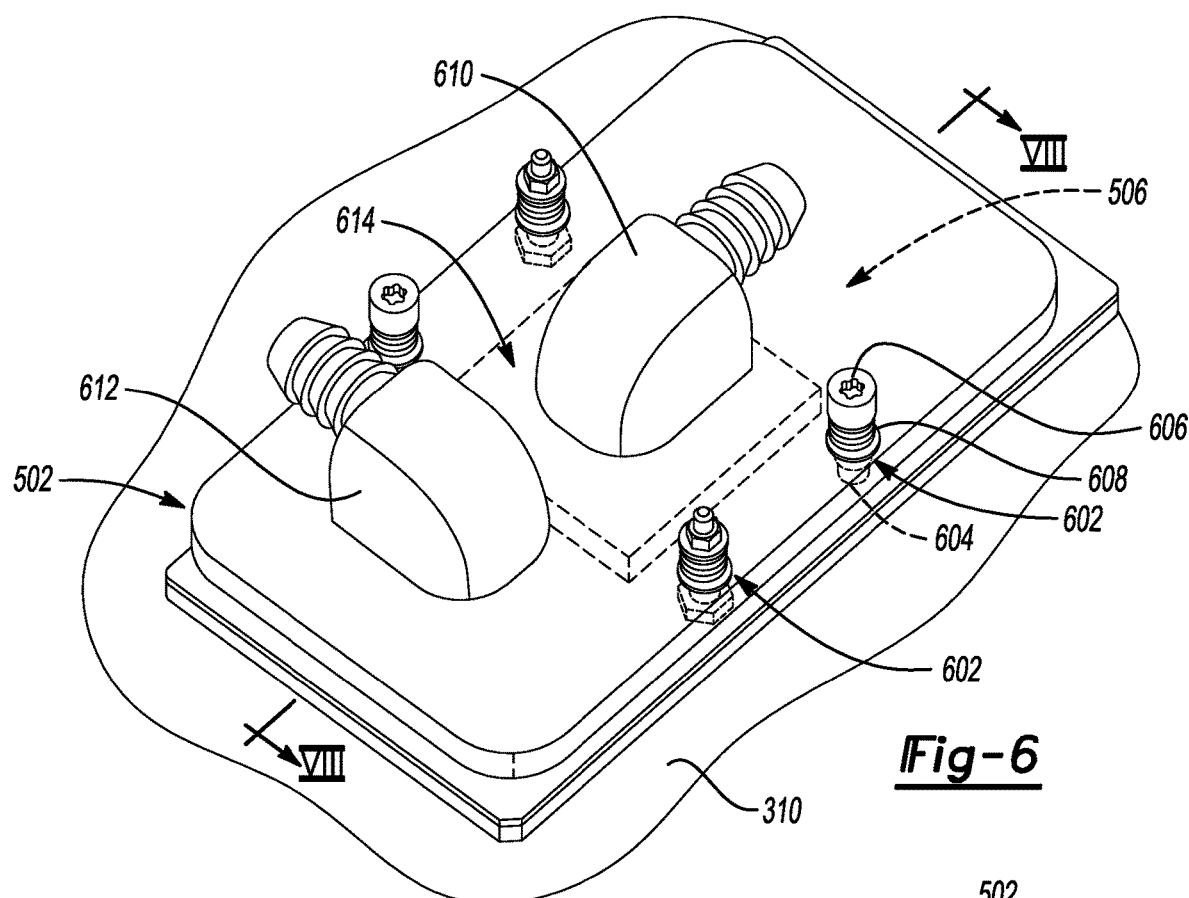
_Fig-6_
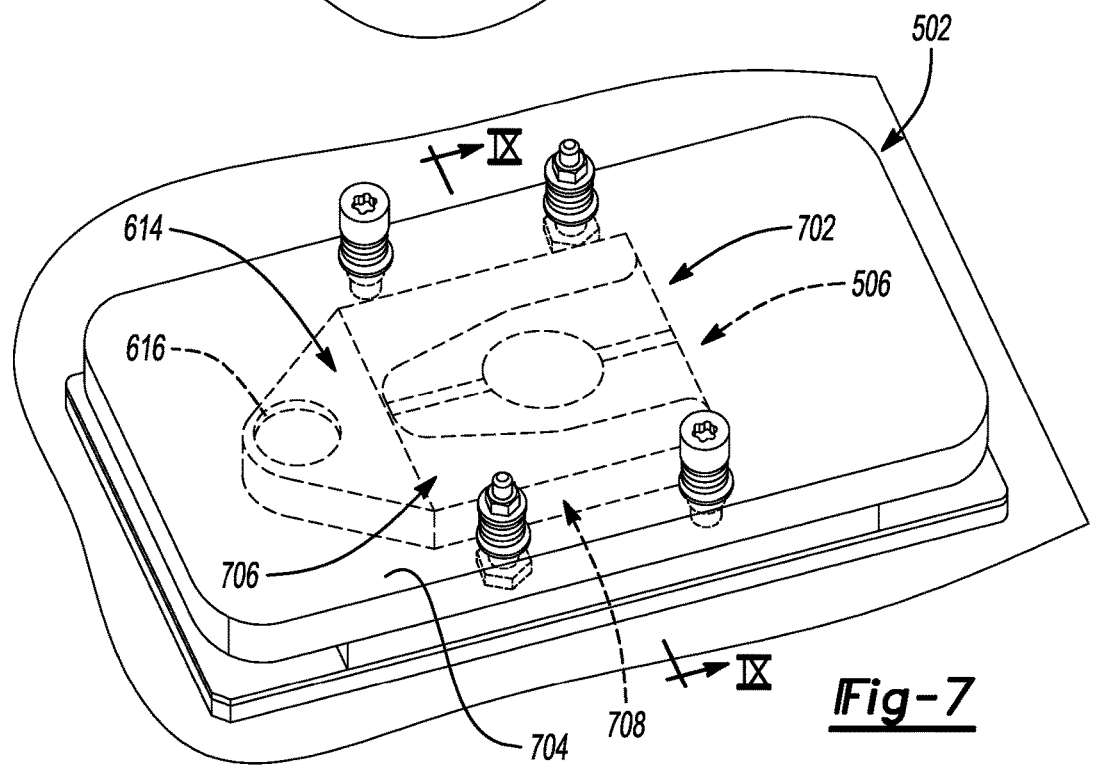
_Fig-7_

MODULAR COLD PLATE FOR ELECTRONIC CONTROL MODULE

TECHNICAL FIELD

One or more embodiments relate to a cooling system for an electronic control module that includes a modular cold plate.

BACKGROUND

A vehicle system may monitor an environment external to a vehicle for obstacle detection and avoidance. The vehicle system may include multiple sensor assemblies for monitoring objects proximate to the vehicle in the near-field and distant objects in the far-field. Each sensor assembly may include one or more sensors, such as a camera, a radio detection and ranging (radar) sensor, a light detection and ranging (lidar) sensor, and a microphone. A lidar sensor includes one or more emitters for transmitting light pulses away from the vehicle, and one or more detectors for receiving and analyzing reflected light pulses. The vehicle system may determine the location of objects in the external environment based on data from the sensors, and control one or more systems, e.g., a powertrain, braking systems, and steering systems based on the locations of the objects.

The vehicle system includes one or more electronic control modules to control the sensors and process the data collected from the sensors. These electronic control modules include electronics that generate heat during operation. Accordingly, the vehicle may include a cooling system to regulate the temperature of the electronic control module.

SUMMARY

In one embodiment, a control module is provided with a chassis and a circuit board assembly that is mounted to the chassis and includes electronics that generate heat during operation. A cold plate is mounted to the chassis and adjacent to the circuit board assembly. The cold plate defines an opening. A cold block is coupled to the cold plate and comprises: a base disposed within the opening of the cold plate and coupled to the electronics; a plurality of fins extending from the base; the plurality of fins being spaced apart from each other to form channels therebetween; and a plate that is spaced apart from the base to form a cavity. The plate defines an inlet that is arranged over a central portion of the plurality of fins to receive a liquid therethrough to facilitate impinging flow of the liquid through the channels to transfer heat from the electronics.

In another embodiment, a cooling system is provided with a cold plate and a cold block. The cold plate is configured to mount to a chassis of a control module adjacent to a circuit board assembly. The circuit board assembly comprises electronics that generate heat during operation. The cold plate defines an opening. A cold block is coupled to the cold plate and comprises: a base disposed within the opening of the cold plate and spring biased to engage the electronics; a plurality of fins extending from the base; the plurality of fins being spaced apart from each other to form channels therebetween; and a plate spaced apart from the base to form a cavity. The plate defines an inlet arranged over a central portion of the plurality of fins to receive a liquid to facilitate impinging flow of a liquid through the channels to transfer heat from the electronics.

In yet another embodiment, a control module is provided with a chassis defining a first cavity and a second cavity. A first circuit board assembly is mounted to the chassis and disposed within the first cavity. The first circuit board assembly comprises electronics that generate heat during operation. A first cold plate is mounted to the chassis to enclose the first circuit board assembly within the first cavity. A second circuit board assembly is mounted to the chassis and disposed within the second cavity. The second circuit board assembly comprises at least two high-performance processors that generate heat during operation. A second cold plate is mounted to the chassis adjacent to the second circuit board assembly within the second cavity. The second cold plate defines at least two openings, each opening being aligned with one of the high-performance processors. At least two cold blocks are coupled to the second cold plate. Each cold block is disposed within an opening of the at least two openings and defines a chamber for receiving a liquid and facilitating impinging flow of the liquid through the chamber to absorb heat from the aligned high-performance processor.

BRIEF DESCRIPTION OF THE DRAWINGS

FIG. 6 is an enlarged view of a cold block of the modular cold plate of FIG. 5, in accordance with aspects of the disclosure.

FIG. 7 is another enlarged view of the cold block of FIG. 6, illustrated without fittings in accordance with aspects of the disclosure.

DETAILED DESCRIPTION

Figure 1:
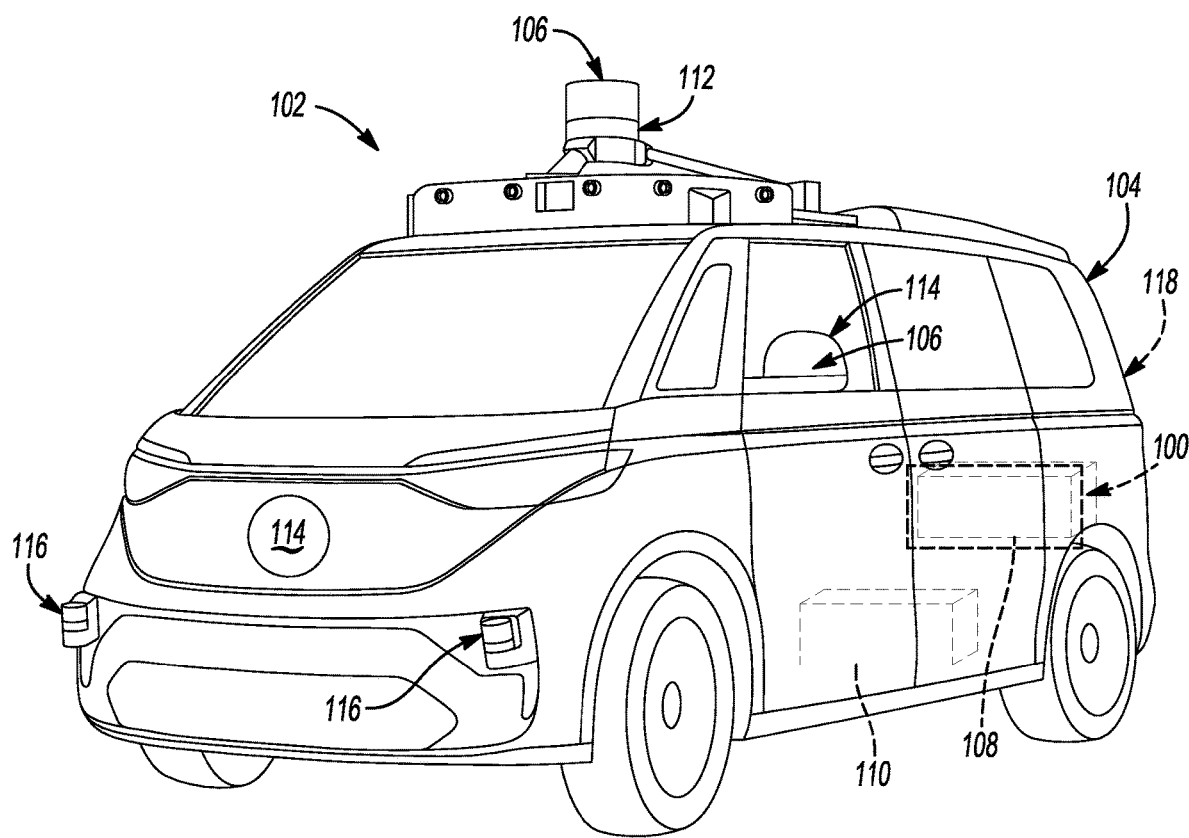
FIG. 1 is a front-perspective view of an exemplary vehicle with a cooling system for a self-driving system (SDS), in accordance with aspects of the disclosure.

As required, detailed embodiments are disclosed herein; however, it is to be understood that the disclosed embodiments are merely exemplary and may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present disclosure.

Electronic control modules (ECMs) generate heat during operation. Different components across the ECM generate heat differently and thus create nonuniform heat distribution and may even generate hot spots. A conventional ECM for a vehicle application may include components that operate at temperatures over 60° C. under load. Self-driving vehicles may include high-performance processors, e.g., graphical processing units (GPUs) for image processing, that operate at higher temperatures than conventional ECM processors. For example, some GPUs operate at over 350 Watts, which may result in operating temperatures up to 85° C.

Accordingly, the vehicle may include a cooling system to regulate the temperature of these ECMs. The cooling system may include one or more heatsinks to transfer heat from the electronics to a fluid medium, such as air or liquid. The cooling system may also include one or more mechanisms to control the flow of the fluid in the fluid medium. For example, the cooling system may include a fan to control air flow through an air medium. The cooling system may also include pumps and valves to control liquid flow through a liquid medium. However, conventional cooling systems do not include a cold plate solution with the ability to counter heat generated by specific high heat generating components.

The mounting location of the ECM affects its ambient temperature and the type of cooling system available. For example, an ECM mounted within a vehicle may experience higher ambient temperatures than an ECM mounted in a non-vehicle application, e.g., an enterprise or data center computer. A liquid cooling system for a vehicle application may utilize existing vehicle cooling system components, such as a radiator, a reservoir, and pumps, which may limit the temperature of the liquid coolant. A liquid cooling system for a vehicle application typically circulates a liquid through a radiator to cool it as the liquid loses heat to the ambient air. However, the ambient air in a warm climate may exceed 55° C., which limits the minimum liquid coolant temperature available. A cooling system for cooling an ECM with high-performance processors, e.g., GPUs, in warm climates must be thermally efficient to account for the low difference between coolant temperature (e.g., 55° C.) and maximum operating temperature (e.g., 85° C.).

According to some aspects of the disclosure, the cooling system provides solutions to maximize efficiency by including a cooling system with a modular cold plate. The modular cold plate includes openings arranged adjacent to high-performance processors of a circuit board assembly, e.g., GPUs, and a manifold arranged adjacent to other components of the circuit board assembly. The cooling system includes cold blocks that are coupled to the modular cold plate and spring biased to engage the high-performance processors. The cooling system includes a cooling circuit that circulates liquid through the cold blocks and the modular cold plate at a high flow rate, e.g., approximately five liters per minute. The cold blocks are arranged upstream from the modular cold plate such that the liquid cools the higher temperature components first.

The cooling system improves thermal efficiency of the ECM by arranging the cold blocks upstream from the modular cold plate in the cooling circuit such that the liquid cools the high temperature components first. Additionally, by using a high flow rate, e.g., approximately five liters per minute, the cooling system cools high temperature components despite having a low temperature delta between an inlet and an outlet temperature.

The cooling system improves serviceability over existing cooling systems by allowing removal of the cold blocks without removing the cold plate. This allows access to the high-performance processors without requiring extensive disassembly of the ECM. The modular cold plate design also allows for design changes to the electronics without major redesign of the modular cold plate. For example, if the GPU is replaced with another processor having different dimensions and heat characteristics, the cold block could be redesigned without changing the modular cold plate.

With reference to FIG. 1, a cooling system is illustrated in accordance with aspects of the disclosure and generally referenced by numeral 100. The cooling system 100 is integrated with a vehicle system, such as a self-driving system (SDS) 102 of a vehicle 104, such as a self-driving vehicle. The SDS 102 includes a plurality of range sensors 106 that monitor a field-of-view (FoV) about the vehicle 104. The SDS 102 also includes multiple ECMs, such as an autonomous vehicle subsystem (AVS) 108 and a complimentary autonomous vehicle subsystem (CAVS) 110. The cooling system 100 is integrated with the AVS 108 and includes a modular cold plate to provide localized cooling of high heat generating components of the AVS 108. Aspects of the cooling system may also be applied to the CAVS, or other vehicle ECMs, according to aspects of the disclosure.

The SDS 102 includes multiple sensor assemblies to collectively monitor a 360-degree FoV around the vehicle 104 in the near-field and the far-field. The SDS 102 includes a top sensor assembly 112, two side sensor assemblies 114, two front sensor assemblies 116, and a rear-sensor assembly 118, according to aspects of the disclosure. Each sensor assembly includes one or more range sensors 106, such as a camera, a lidar sensor, and a radar sensor.

The top sensor assembly 112 is mounted to a roof of the vehicle 104 and includes multiple range sensors 106, such as one or more lidar sensors and cameras. The lidar sensor rotates about an axis to scan a 360-degree FoV about the vehicle 104. The side sensor assemblies 114 are mounted to a side of the vehicle 104, for example, to a front fender, or within a side-view mirror. Each side sensor assembly 114 includes multiple range sensors 106, such as, a lidar sensor and a camera to monitor a FoV adjacent to the vehicle 104 in the near-field. The front sensor assemblies 116 are mounted to a front of the vehicle 104, such as, adjacent to the headlights. Each front sensor assembly 116 includes multiple range sensors 106, for example, a lidar sensor, a radar sensor, and a camera to monitor a FoV in front of the vehicle 104 in the far-field. The rear-sensor assembly 118 is mounted to an upper rear portion of the vehicle 104, such as adjacent to a Center High Mount Stop Lamp (CHMSL). The rear-sensor assembly 118 also includes multiple range sensors 106, such as a camera and a lidar sensor for monitoring the FoV behind the vehicle 104.

Figure 2:
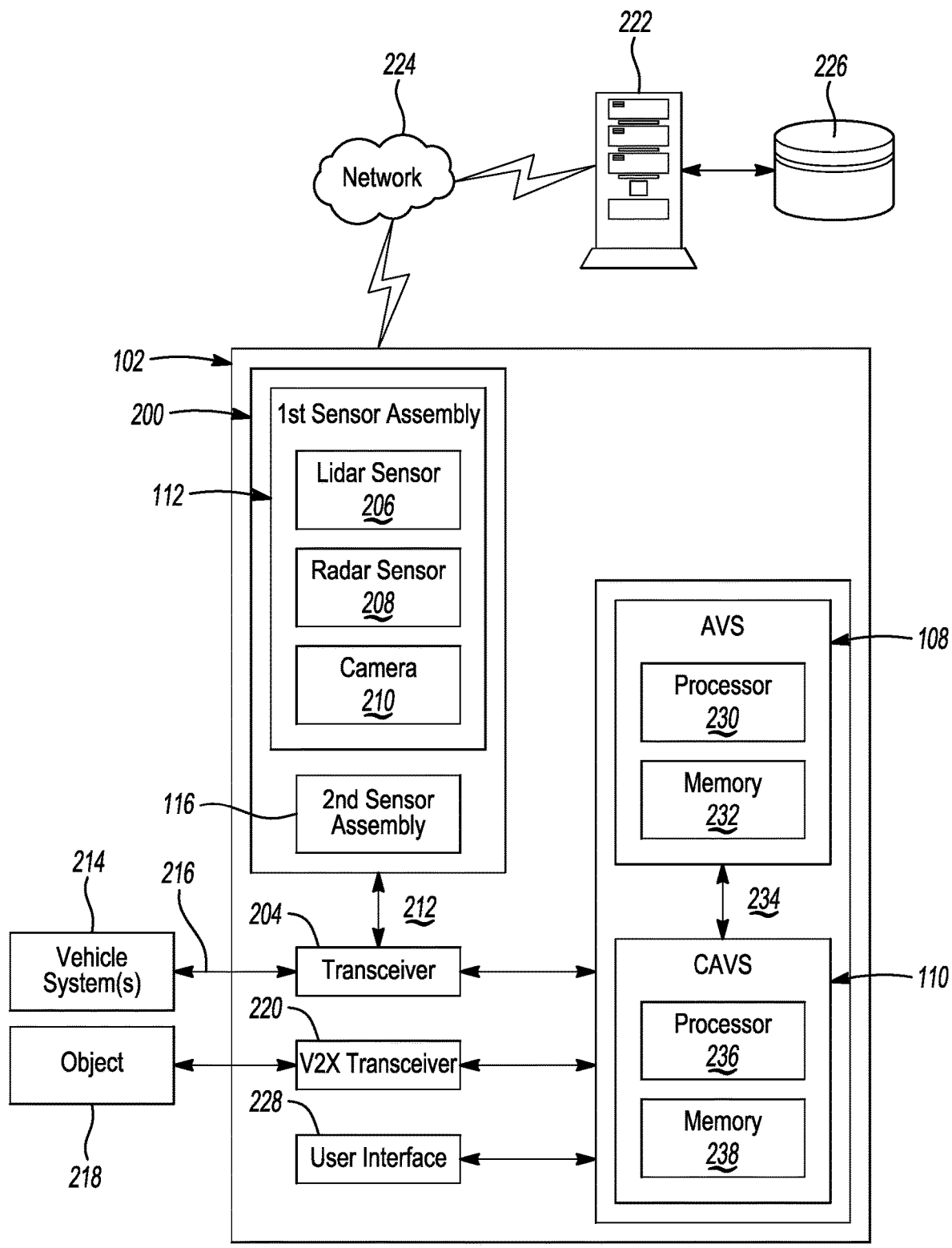
FIG. 2 is a schematic diagram illustrating an exemplary architecture of the SDS of FIG. 1, in accordance with aspects of the disclosure.

FIG. 2 illustrates communication between the SDS 102 and other systems and devices, according to aspects of the disclosure. The SDS 102 includes a sensor system 200 and redundant subsystems, including the AVS 108 and the CAVS 110 that perform complimentary functionality. The AVS 108 and the CAVS 110 may be mounted in different vehicle locations to provide a back-up in the event one of the ECMs is damaged. For example, the AVS 108 may be mounted within a rear storage area or trunk, and the CAVS 110 may be mounted within a floor compartment of the vehicle 104, as illustrated in FIG. 1. The AVS 108 and CAVS 110 may communicate with other systems and devices by wired or wireless communication through a transceiver 204.

The sensor system 200 includes the sensor assemblies, such as the top sensor assembly 112 and the front sensor assembly 116. The top sensor assembly 112 includes one or more sensors, e.g., a lidar sensor 206, a radar sensor 208, and a camera 210. The lidar sensor 206 includes one or more emitters for transmitting light pulses away from the vehicle 104 and one or more detectors for receiving the reflected light pulses. The emitters may include laser emitter chips or other light emitting devices and may include any number of individual emitters. The detectors may include a photodetector, or an array of photodetectors, that is positioned to receive the reflected light pulses. According to aspects of the disclosure, the detectors include a plurality of pixels, wherein each pixel includes a Geiger-mode avalanche photodiode, for detecting reflections of the light pulses during each of a plurality of detection frames. The camera 210 may be a visible spectrum camera, an infrared camera, etc., according to aspects of the disclosure. The sensor system 200 may include additional sensors, such as a microphone, a sound navigation and ranging (SONAR) sensor, temperature sensors, position sensors (e.g., global positioning system (GPS), etc.), location sensors, fuel sensors, motion sensors (e.g., inertial measurement units (IMU), etc.), humidity sensors, occupancy sensors, or the like. The sensor system 200 provides sensor data 212 that is indicative of the external environment of the vehicle 104. The AVS 108 and the CAVS 110 analyze the sensor data to identify and determine the location of external objects relative to the vehicle 104, e.g., the location of traffic lights, remote vehicles, pedestrians, etc.

The SDS 102 also communicates with one or more vehicle systems 214 through the transceiver 204, such as an engine, a transmission, a navigation system, a steering system, and a braking system. The AVS 108 and the CAVS 110 may receive information from the vehicle systems 214 that is indicative of present operating conditions of the vehicle 104, such as vehicle speed, engine speed, turn signal status, brake position, vehicle position, steering angle, and ambient temperature. The AVS 108 and the CAVS 110 may also control one or more of the vehicle systems 214 based on the sensor data 212, for example, the AVS 108 and the CAVS 110 may control a braking system and a steering system to avoid an obstacle. The AVS 108 and the CAVS 110 may communicate directly with the vehicle systems 214 or communicate indirectly with the vehicle systems 214 over a vehicle communication bus, such as a CAN bus 216.

The SDS 102 may also communicate with external objects 218, such as remote vehicles and structures, to collect and share the external environment information. The SDS 102 may include a vehicle-to-everything (V2X) transceiver 220 that is connected to the AVS 108 for communicating with the objects 218. For example, the SDS 102 may use the V2X transceiver 220 for communicating directly with: a remote vehicle by vehicle-to-vehicle (V2V) communication, a structure (e.g., a sign, a building, or a traffic light) by vehicle-to-infrastructure (V2I) communication, and a motorcycle by vehicle-to-motorcycle (V2M) communication. Each V2X device may provide information indicative of its own status, and/or the status of another V2X device.

The SDS 102 may communicate with a remote computing device 222 over a communications network 224 using one or more of the transceivers 204, 220. For example, the SDS 102 may provide data to the remote computing device 222 that is indicative of a message or visual that indicates the location of the objects 218 relative to the vehicle 104, based on the sensor data 212. The remote computing device 222 may include one or more servers to process one or more processes of the technology described herein. The remote computing device 222 may also communicate data with a database 226 over the network 224.

The SDS 102 also communicates with a user interface 228 to provide information to a user of the vehicle 104. The AVS 108 and the CAVS 110 may control the user interface 228 to provide a message or visual that indicates the location of the objects 218 relative to the vehicle 104, based on the sensor data 212.

The AVS 108 includes a processing unit, or processor 230, that may include any number of microprocessors, GPUs, ASICs, ICs, memory (e.g., FLASH, ROM, RAM, EPROM and/or EEPROM) and software code to co-act with one another to perform a series of operations. Such hardware and/or software may be grouped together in assemblies to perform certain functions. The processor 230 is a high-performance processor, such as a GPU according to aspects of the disclosure. Any one or more of the controllers or devices described herein include computer executable instructions that may be compiled or interpreted from computer programs created using a variety of programming languages and/or technologies. The AVS 108 also includes memory 232, or non-transitory computer-readable storage medium, that is capable of executing instructions of a software program. The memory 232 may be, but is not limited to, an electronic storage device, a magnetic storage device, an optical storage device, an electromagnetic storage device, a semi-conductor storage device, or any suitable combination thereof. In general, the processor 230 receives instructions, for example from the memory 232, a computer-readable medium, or the like, and executes the instructions. The AVS 108 also includes predetermined data, or "look up tables" that is stored within memory, according to aspects of the disclosure.

Although the AVS 108 is described as a single controller, it may contain multiple controllers, or may be embodied as software code within one or more other controllers. The AVS 108 and the CAVS 110 may communicate with each other over a private communication interface 234, which may be a Controller Area Network Flexible Data-Rate (CAN-FD) two-wire interconnection. In other embodiments, the private communication interface 234 includes wireless communication. The CAVS 110 has architecture like that of the AVS 108, including a processor 236 and memory 238.

Figure 3:
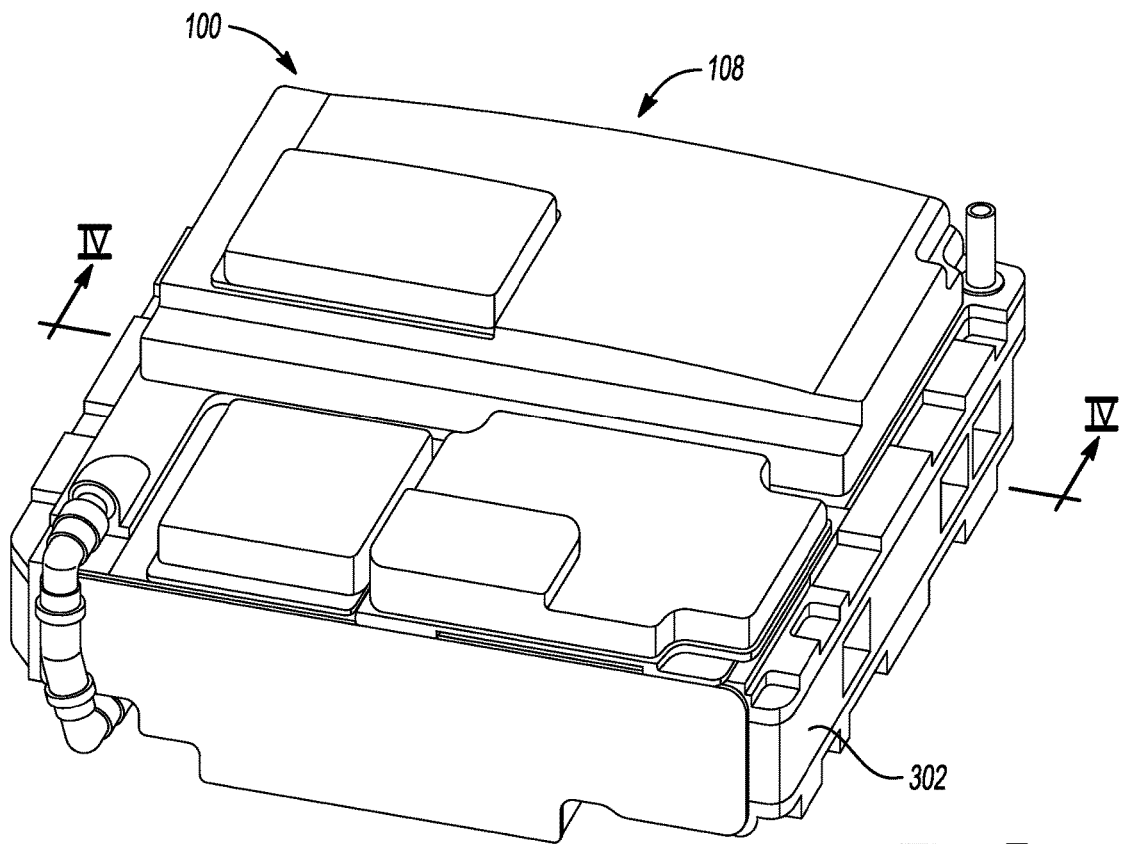
FIG. 3 is a top perspective view of an electronic control module of the cooling system, in accordance with aspects of the disclosure.
Figure 4:
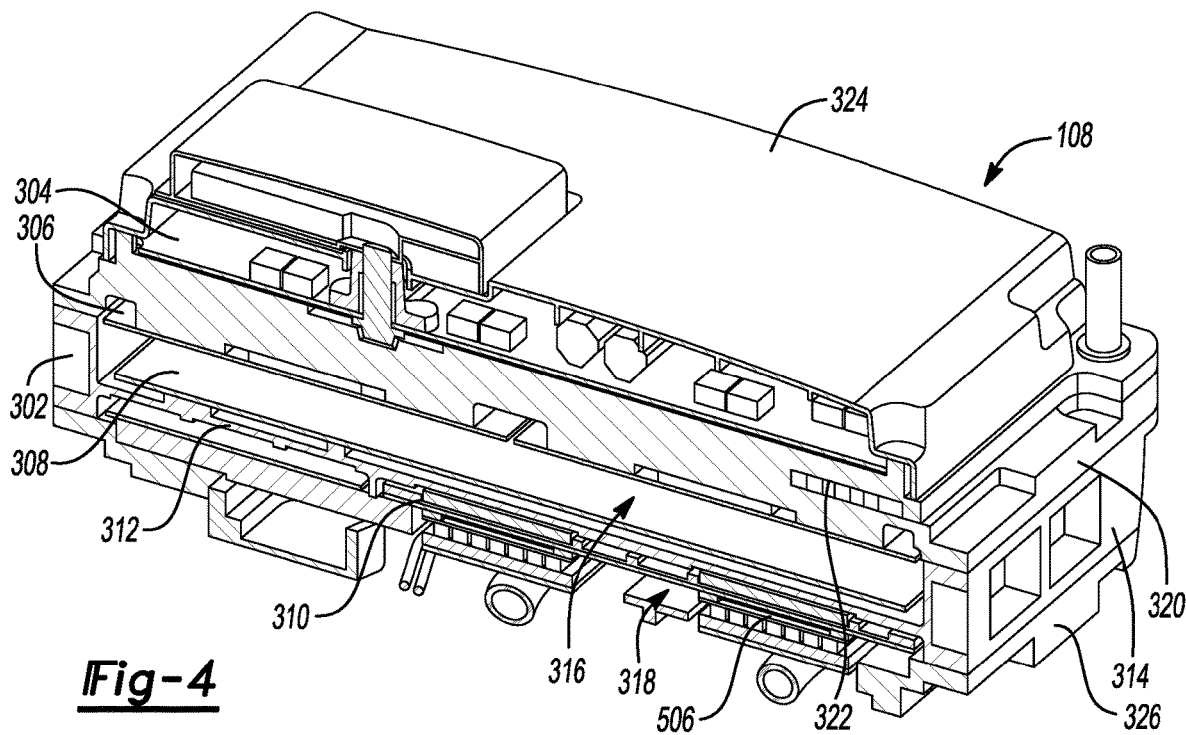
FIG. 4 is a section view of the electronic control module of FIG. 3 taken along section line IV-IV, in accordance with aspects of the disclosure.

With reference to FIGS. 3-4, the cooling system 100 is coupled to the AVS 108 for cooling electronics. The AVS 108 includes a chassis 302 that supports a plurality of circuit board assemblies, including a first circuit board assembly 304, a second circuit board assembly 306, a third circuit board assembly 308, and a fourth circuit board assembly 310, according to aspects of the disclosure. The circuit board assemblies 304-310 include electronics that generate heat during operation. The chassis 302 includes a base 312 and sidewalls 314 that extend transversely in opposing directions from a periphery of the base 312 to form an upper cavity 316 and a lower cavity 318.

The cooling system 100 includes a first cold plate 320 that forms a first manifold 322 for cooling electronics of the first circuit board assembly 304 and the second circuit board assembly 306. The first cold plate 320 is mounted to the sidewalls 314 to enclose the upper cavity 316. The first manifold 322 includes a series of passageways for circulating a liquid 323 (shown in FIG. 8).

The first circuit board assembly 304 is mounted to an outer surface of the first cold plate 320 to transfer heat by conduction. The second circuit board assembly 306 is mounted to an inner surface of the cold plate 320 and disposed within the upper cavity 316. The first circuit board assembly 304 and the second circuit board assembly 306 transfers heat to the cold plate 320 by conduction, which in turn, transfers heat to the liquid 323 flowing through the first manifold 322 by convection. The cooling system 100 also includes a cover 324 that is mounted to the first manifold 322 to enclose the first circuit board assembly 304.

Figure 5:
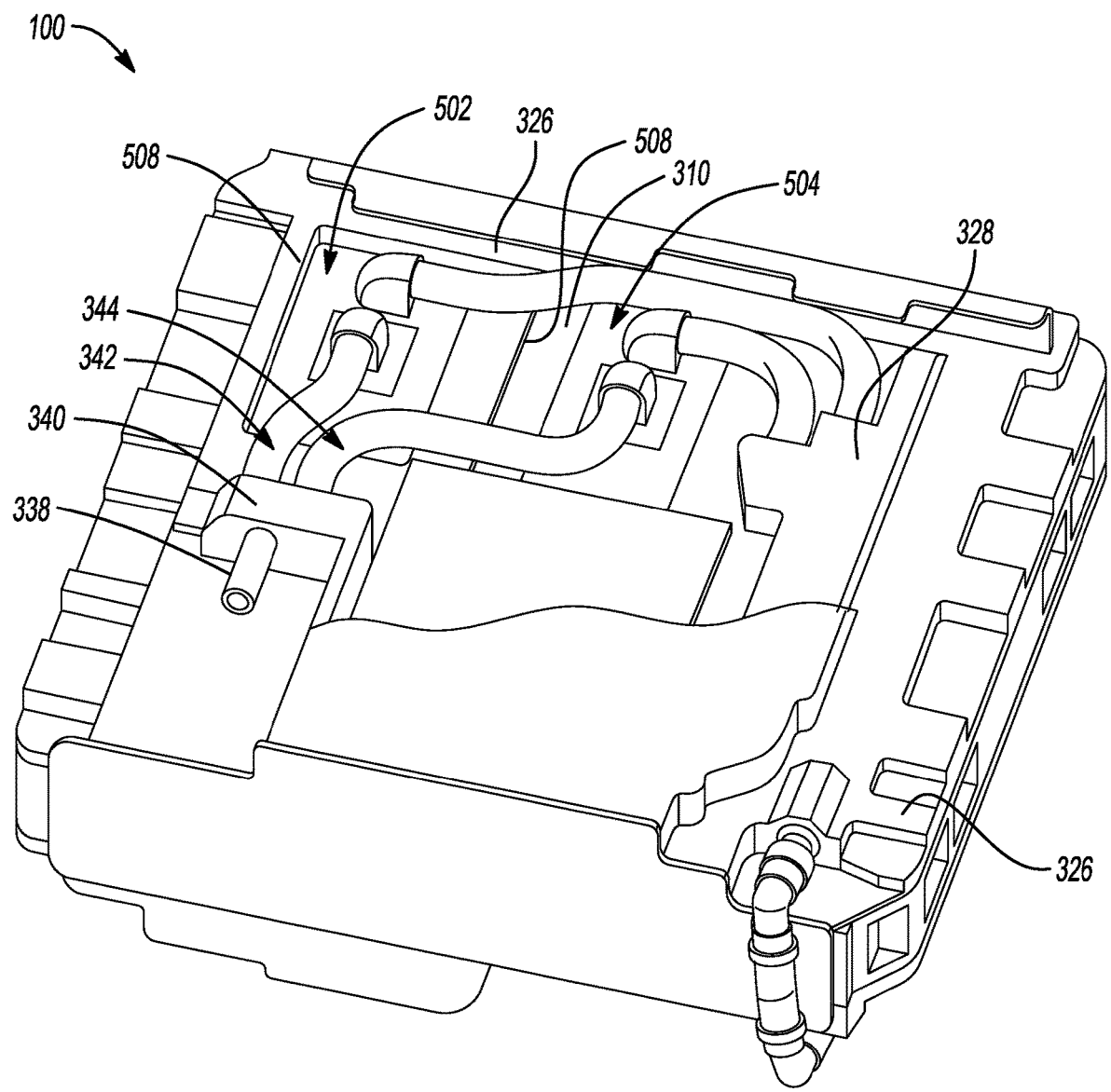
FIG. 5 is a bottom partially-fragmented perspective view of the electronic control module of FIG. 3, illustrating a modular cold plate of the cooling system in accordance with aspects of the disclosure.

Referring to FIGS. 4 and 5, the cooling system 100 includes a second cold plate 326 that forms a second manifold 328 for cooling electronics of the third circuit board assembly 308 and the fourth circuit board assembly 310. The second cold plate 326 is mounted to the sidewalls 314 to partially enclose the lower cavity 318. The third circuit board assembly 308 is mounted to an upper surface of the base 312 within the upper cavity 316. The fourth circuit board assembly 310 is mounted to a lower surface of the base 312. The cold plates 320, 326 may be separated from a corresponding manifold, according to aspects of the disclosure.

With reference to FIG. 5, the cooling system 100 also includes a first cold block 502 and a second cold block 504 for cooling specific electronics of the fourth circuit board assembly 310. The fourth circuit board assembly 310 includes high-performance processors 506 (shown in FIG. 4), such as GPUs, that generate heat during operation. The second cold plate 326 is formed with openings 508 that are aligned with the high-performance processors 506. Each cold block 502, 504 is coupled to the second cold plate 326 and disposed within one of the openings 508.

The second cold plate 326 and the cold blocks 502, 504 collectively provide a modular cold plate for cooling the high-performance processors 506 of the AVS 108. The modular cold plate design allows for design changes to the electronics without major redesign of the modular cold plate. For example, if the GPU is replaced with another design having different dimensions and heat characteristics, the cold block could be redesigned without changing the modular cold plate.

The cooling system 100 provides the liquid 323 to the cold blocks 502, 504 along parallel paths. The cooling system 100 includes an inlet 338 to receive the liquid 323. The inlet 338 is connected to a junction 340. The cooling system 100 includes a first path 342 that interconnects the first cold block 502 with the junction 340 and the second manifold 328. The cooling system 100 also includes a second path 344 that interconnects the second cold block 504 with the junction 340 and the second manifold 328. The first path 342 and the second path 344 are arranged in parallel with common length hoses and fittings to provide equal resistance in each path such that the liquid 323 is supplied to the cold blocks 502, 504 at approximately equal pressure and speed.

With reference to FIG. 6, the first cold block 502 is spring-biased to engage the high-performance processor 506 of the fourth circuit board assembly 310. A series of posts 602 extend from the fourth circuit board assembly 310. The posts 602 extend through apertures 604 formed in the first cold block 502 and include a cap 606 formed at a distal end. The cap 606 retains a compression spring 608 along the post 602 to bias the first cold block 502 to engage the high-performance processor 506 to improve heat transfer to the first cold block 502. The cooling system 100 may also include a thermal paste that is disposed at the interface between the first cold block 502 and the high-performance processor 506 to further improve heat transfer and thermal efficiency.

Referring to FIGS. 6 and 7, the first path 342 includes a first fitting 610 and a second fitting 612 to connect the first cold block 502 to the first path 342. The first fitting 610 connects to a central portion of the first cold block 502 to supply the liquid 323. The liquid 323 circulates through a cavity 614 of the first cold block 502 and absorbs heat from the high-performance processor 506. The heated liquid 323 exits the cavity 614 through an outlet 616 (shown in FIG. 7) and through the second fitting 612.

With reference to FIG. 7, the first cold block 502 includes a heatsink 702 to dissipate heat from the high-performance processor 506. The heatsink 702 includes a base 704 and a plurality of fins 706 that extend away from the base 704 into the cavity 614. The fins 706 are spaced apart from each other to form channels 708 between adjacent fins. The fins 706 are closely spaced apart from each other to form "micro-channels" and maximize the surface area of the fins 706 that are contacted by the liquid 323 to maximize thermal efficiency, according to aspects to the disclosure.

Figure 8:
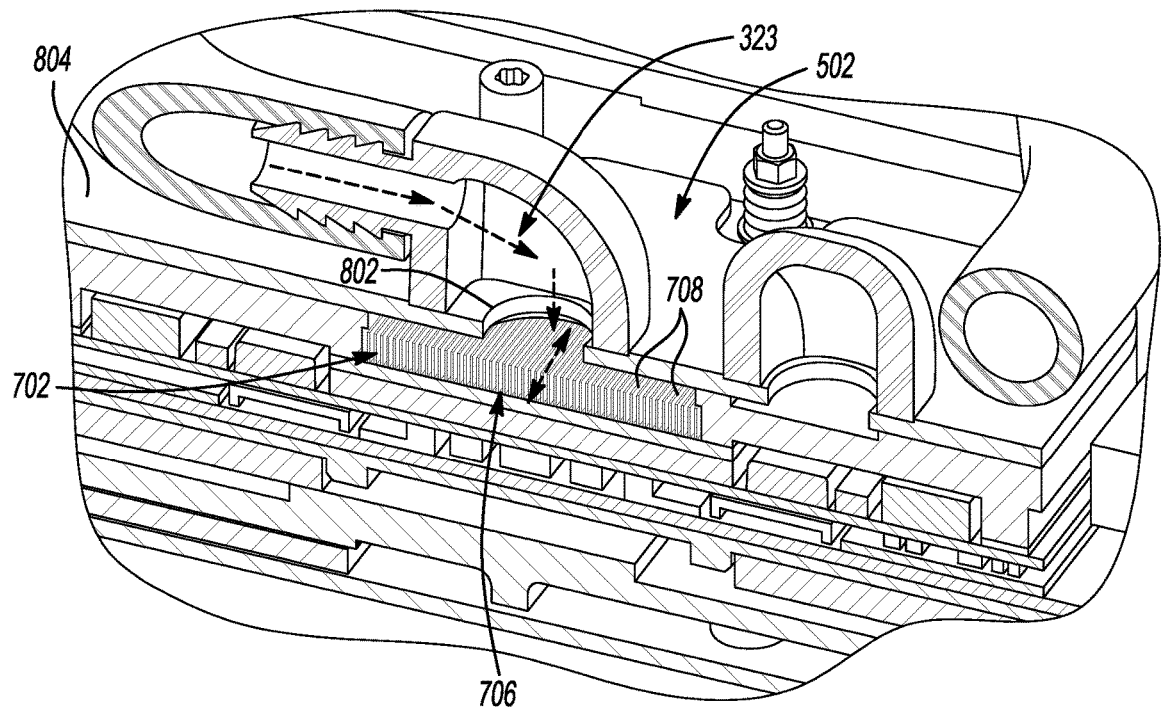
FIG. 8 is an enlarged section view of the cold block of FIG. 6 taken along section line VIII-VIII, in accordance with aspects of the disclosure.

Referring to FIG. 8, the first cold block 502 includes an inlet 802 that is formed through a plate 804 to receive the liquid 323. The inlet 802 is arranged over a central portion of the heatsink 702 to spray the liquid 323 along an orthogonal path toward the heatsink 702 to provide impinging flow outward through the channels 708 to transfer heat from the high-performance processor 506 to the liquid 323 through the heatsink 702.

Figure 9:
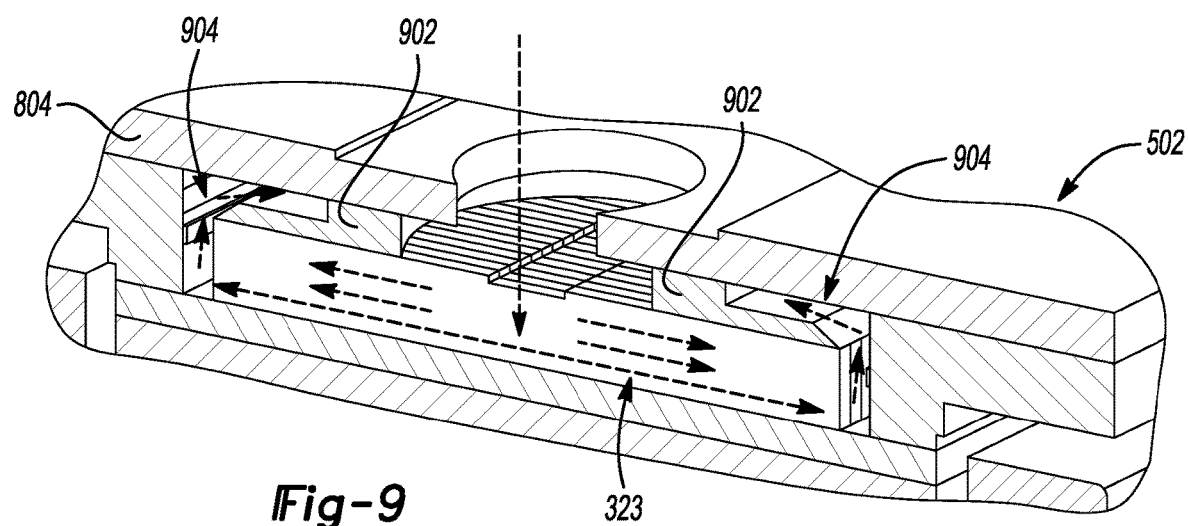
FIG. 9 is an enlarged section view of the cold block of FIG. 7 taken along section line IX-IX, in accordance with aspects of the disclosure.

Referring to FIG. 9, the heatsink 702 includes supports 902 that extend from the plurality of fins 706 to the plate 804 to separate the cavity 614 into two chambers 904. The liquid 323 flows outward through the channels 708 and into the chambers 904 due to gravity, because FIG. 9 illustrates the first cold block 502 arranged upside down. The chambers 904 are contoured to direct the liquid 323 away from the impinging flow of the liquid 323 at the inlet 802 and toward the outlet 616 shown in FIG. 7. Referring back to FIG. 5, the second cold block 504 includes similar features as the first cold block 502, therefore the above description of the first cold block 502 with reference to FIGS. 6-9 is applicable to the second cold block 504.

Figure 10:
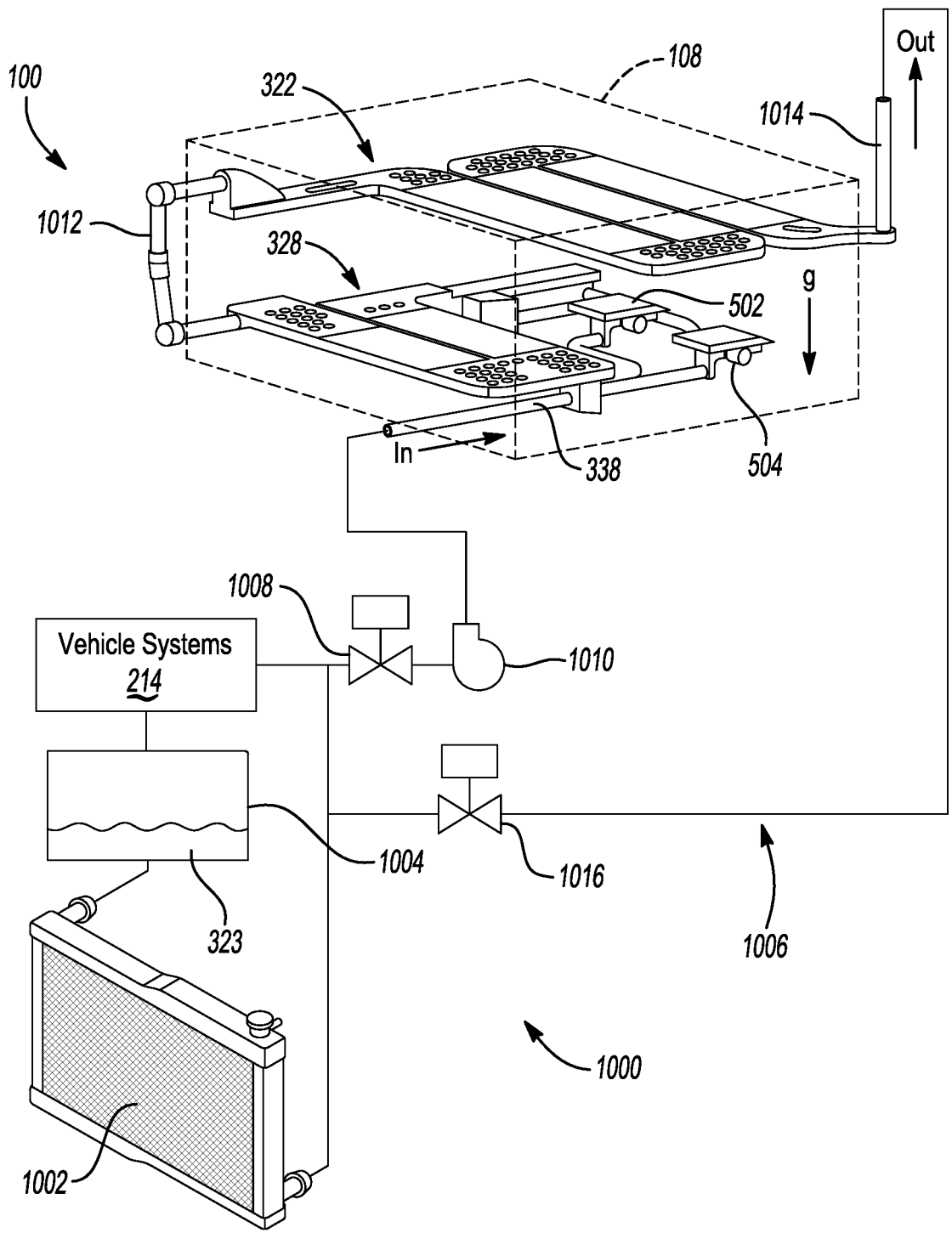
FIG. 10 is an exemplary architecture of the cooling system, in accordance with aspects of the disclosure.

With reference to FIG. 10, the cooling system 100 may be coupled to a vehicle cooling system 1000 for receiving the liquid 323. The vehicle cooling system 1000 includes a radiator 1002 for cooling the liquid 323, and a reservoir 1004 for storing the liquid 323. The vehicle cooling system 1000 circulates the liquid 323 through the radiator 1002 where it loses heat to ambient air. The vehicle cooling system 1000 supplies the liquid 323 to one or more of the vehicle system(s) 214, such as the engine or transmission, to cool the vehicle system 214.

The cooling system 100 forms a cooling circuit 1006 that circulates the liquid 323 through the AVS 108 to absorb heat from the circuit board assemblies 304-310. The cooling circuit 1006 includes an actuator 1008 for connecting to the vehicle cooling system 1000. The actuator 1008 includes a valve that may be controlled to open to supply the liquid 323. The cooling circuit 1006 may also include a pump 1010 to increase the pressure of the liquid 323 supplied to the cold blocks 502, 504. The liquid 323 flows through the cold blocks 502, 504, while absorbing heat from the high-performance processor 506, to the second manifold 328. The liquid 323 flows through the second manifold 328 while absorbing heat from the third circuit board assembly 308 and the fourth circuit board assembly 310. The cooling circuit 1006 includes a crossover tube 1012 that connects the first manifold 322 and the second manifold 328. The liquid 323 flow through the first manifold 322, while absorbing heat from the first circuit board assembly 304 and the second circuit board assembly 306, and exits the AVS 108 through an outlet 1014.

The cooling system 100 controls the actuator 1008 and the pump 1010 to circulate the liquid 323 through the cooling circuit 1006 at a high flow rate, e.g., approximately five liters per minute, to maximize thermal efficiency. The cold blocks 502, 504 are arranged upstream from the manifolds 322, 328 such that the liquid 323 cools the higher temperature components, e.g., the high-performance processors 506 before cooling lower temperature components of the circuit board assemblies 304-310.

The cooling circuit 1006 may include another actuator 1016 that is controlled to open to return the liquid 323 to the vehicle cooling system 1000. The liquid may be a variety of known substances that can transfer heat, such as water, radiator fluid, and glycol.

Figure 11:
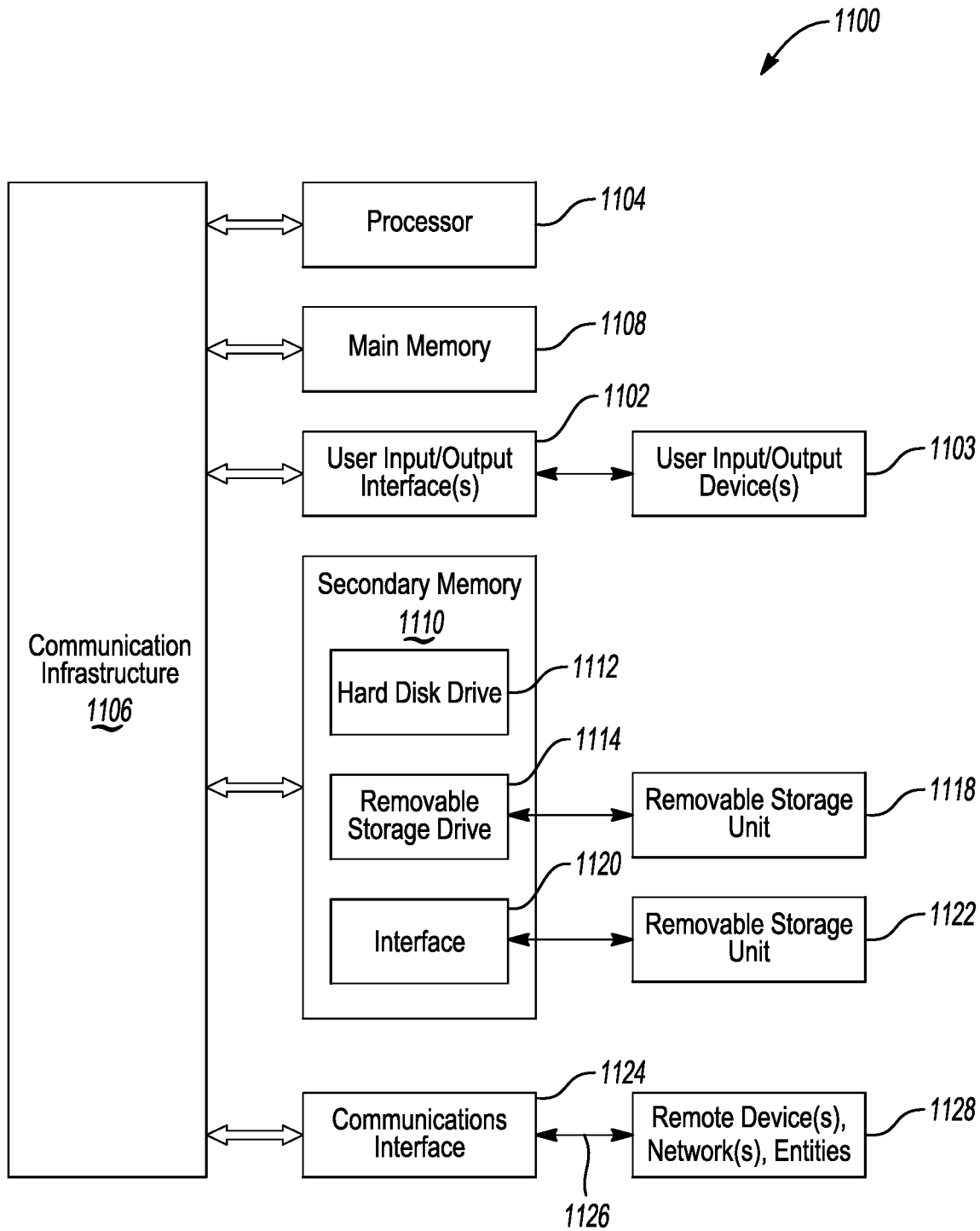
FIG. 11 is a detailed schematic diagram of an example computer system for implementing various embodiments, in accordance with aspects of the disclosure.

The cooling system 100 may include one or more controllers, such as the computer system 1100 shown in FIG. 11. The computer system 1100 may be any computer capable of performing the functions described herein. The computer system 1100 also includes user input/output interface(s) 1102 and user input/output device(s) 1103, such as buttons, monitors, keyboards, pointing devices, etc.

The computer system 1100 includes one or more processors (also called central processing units, or CPUs), such as a processor 1104. The processor 1104 is connected to a communication infrastructure or bus 1106. The processor 1104 may be a graphical processing unit (GPU), e.g., a specialized electronic circuit designed to process mathematically intensive applications, with a parallel structure for parallel processing large blocks of data, such as mathematically intensive data common to computer graphics applications, images, videos, etc.

The computer system 1100 also includes a main memory 1108, such as random-access memory (RAM), that includes one or more levels of cache and stored control logic (i.e., computer software) and/or data. The computer system 1100 may also include one or more secondary storage devices or secondary memory 1110, e.g., a hard disk drive 1112; and/or a removable storage device 1114 that may interact with a removable storage unit 1118. The removable storage device 1114 and the removable storage unit 1118 may be a floppy disk drive, a magnetic tape drive, a compact disk drive, an optical storage device, tape backup device, and/or any other storage device/drive.

The secondary memory 1110 may include other means, instrumentalities or other approaches for allowing computer programs and/or other instructions and/or data to be accessed by computer system 1100, e.g., an interface 1120 and a removable storage unit 1122, e.g., a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

The computer system 1100 may further include a network or communication interface 1124 to communicate and interact with any combination of remote devices, remote networks, remote entities, etc. (individually and collectively referenced by reference number 1128). For example, the communication interface 1124 may allow the computer system 1100 to communicate with remote devices 1128 over a communication path 1126, which may be wired and/or wireless, and which may include any combination of LANs, WANs, the Internet, etc. The control logic and/or data may be transmitted to and from computer system 1100 via communication path 1126.

In an embodiment, a tangible, non-transitory apparatus or article of manufacture comprising a tangible, non-transitory computer useable or readable medium having control logic (software) stored thereon is also referred to herein as a computer program product or program storage device. This includes, but is not limited to, the computer system 1100, the main memory 1108, the secondary memory 1110, and the removable storage units 1118 and 1122, as well as tangible articles of manufacture embodying any combination of the foregoing. Such control logic, when executed by one or more data processing devices (such as the computer system 1100), causes such data processing devices to operate as described herein.

The term "vehicle" refers to any moving form of conveyance that is capable of carrying either one or more human occupants and/or cargo and is powered by any form of energy. The term "vehicle" includes, but is not limited to, cars, trucks, vans, trains, autonomous vehicles, aircraft, aerial drones and the like. A "self-driving vehicle" or "autonomous vehicle" is a vehicle having a processor, programming instructions and drivetrain components that are controllable by the processor without requiring a human operator. An autonomous vehicle may be fully autonomous in that it does not require a human operator for most or all driving conditions and functions, or it may be semi-autonomous in that a human operator may be required in certain conditions or for certain operations, or that a human operator may override the vehicle's autonomous system and may take control of the vehicle. Notably, the present solution is being described herein in the context of an autonomous vehicle. However, the present solution is not limited to autonomous vehicle applications. The present solution may be used in other applications such as an advanced driver assistance system (ADAS), robotic applications, radar system applications, metric applications, and/or system performance applications.

Based on the teachings contained in this disclosure, it will be apparent to persons skilled in the relevant art(s) how to make and use embodiments of this disclosure using data processing devices, computer systems and/or computer architectures other than that shown in FIG. 11. In particular, embodiments can operate with software, hardware, and/or operating system implementations other than those described herein.

It is to be appreciated that the Detailed Description section, and not any other section, is intended to be used to interpret the claims. Other sections can set forth one or more but not all exemplary embodiments as contemplated by the inventor(s), and thus, are not intended to limit this disclosure or the appended claims in any way.

While this disclosure describes exemplary embodiments for exemplary fields and applications, it should be understood that the disclosure is not limited thereto. Other embodiments and modifications thereto are possible, and are within the scope and spirit of this disclosure. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments can perform functional blocks, steps, operations, methods, etc. using orderings different than those described herein.

References herein to "aspects," "one embodiment," "an embodiment," "an example embodiment," or similar phrases, indicate that the embodiment described can include a particular feature, structure, or characteristic, but every embodiment can not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein. Additionally, some embodiments can be described using the expression "coupled" and "connected" along with their derivatives. These terms are not necessarily intended as synonyms for each other. For example, some embodiments can be described using the terms "connected" and/or "coupled" to indicate that two or more elements are in direct physical or electrical contact with each other. The term "coupled," however, can also mean that two or more elements are not in direct contact with each other, but yet still co-operate or interact with each other. The breadth and scope of this disclosure should not be limited by any of the above-described exemplary embodiments, but should be defined only in accordance with the following claims and their equivalents.

While exemplary embodiments are described above, it is not intended that these embodiments describe all possible forms of the disclosure. Rather, the words used in the specification are words of description rather than limitation, and it is understood that various changes may be made without departing from the spirit and scope of the disclosure. Additionally, the features of various implementing embodiments may be combined to form further embodiments.

What is claimed is:

1. A control module comprising:
   a chassis;
   a circuit board assembly mounted to the chassis and comprising electronics that generate heat during operation;
   a cold plate mounted to the chassis and adjacent to the circuit board assembly, the cold plate defining an opening; and
   a cold block coupled to the cold plate, the cold block comprising:
   a base disposed within the opening of the cold plate and coupled to the electronics,
   a plurality of fins extending from the base, the plurality of fins being spaced apart from each other to form channels therebetween,
   a plate spaced apart from the base to form a cavity, the plate defining an inlet arranged over a central portion of the plurality of fins to receive a liquid therethrough to facilitate impinging flow of the liquid through the channels to transfer the heat from the electronics, and
   at least one support extending from an outer portion of the plurality of fins to engage the plate and separate the cavity into at least one chamber isolated from the inlet, wherein an inner surface of the plate is contoured to guide the liquid within the at least one chamber toward an outlet formed in the cold block.

2. The control module of claim 1, wherein the base is spring biased to engage the electronics.

3. The control module of claim 1, wherein the electronics include a high-performance processor.

4. The control module of claim 1, wherein the cold plate is in thermal communication with the circuit board assembly to transfer the heat.

5. The control module of claim 4, wherein the cold plate defines a manifold, the manifold being connected to an outlet of the cold block to receive the liquid and transfer the heat generated by the circuit board assembly to the liquid.

6. The control module of claim 1, wherein the cold block comprises at least two cold blocks arranged in parallel with each other and configured to provide equal resistance such that the liquid circulates through the at least two cold blocks at approximately equal pressure and speed.

7. A vehicle system comprising:
   a range sensor configured to monitor an environment external to a vehicle; and
   the control module according to claim 1;
   wherein the circuit board assembly is further configured to control at least one of a steering system and a braking system based on data from the range sensor.

8. A vehicle comprising:
   the vehicle system according to claim 7, wherein the circuit board assembly is configured to control at least one of the steering system and the braking system to avoid an obstacle based on the data from the range sensor.

9. A vehicle comprising:
   the control module according to claim 1, wherein the circuit board assembly is configured to control at least one vehicle system.

10. A cooling system comprising:
    a cold plate configured to mount to a chassis of a control module adjacent to a circuit board assembly, the circuit board assembly comprising electronics that generate heat during operation, the cold plate defining an opening; and
    a cold block coupled to the cold plate, the cold block comprising:
    a base disposed within the opening of the cold plate and spring biased to engage the electronics,
    a plurality of fins extending from the base, the plurality of fins being spaced apart from each other to form channels therebetween,
    a plate spaced apart from the base to form a cavity, the plate defining an inlet arranged over a central portion of the plurality of fins to receive a liquid therethrough to facilitate impinging flow of the liquid through the channels to transfer the heat from the electronics, and
    at least one support extending from an outer portion of the plurality of fins to engage the plate and separate the cavity into at least one chamber isolated from the inlet, wherein an inner surface of the plate is contoured to guide the liquid within the at least one chamber toward an outlet formed in the cold block.

11. The cooling system of claim 10, further comprising:
    a manifold defined by the cold plate and connected to an outlet of the cold block to receive the liquid and transfer the heat generated by the circuit board assembly.

12. The cooling system of claim 10, wherein the cold block comprises at least two cold blocks arranged in parallel with each other and configured to provide equal resistance such that the liquid circulates through the at least two cold blocks at approximately equal pressure and speed.

13. The cooling system of claim 10, further comprising:
a pump coupled to the cold block and configured to increase a flow rate of the liquid circulating through the cold block.

14. A vehicle system comprising:
a range sensor configured to monitor an environment external to a vehicle; and
the cooling system according to claim 10;
wherein the circuit board assembly is further configured to control at least one of a steering system and a braking system based on data from the range sensor.

15. A vehicle comprising:
the vehicle system according to claim 14;
wherein the cooling system is configured to cool the circuit board assembly; and
the circuit board assembly is configured to control at least one of the steering system and the braking system to avoid an obstacle based on the data from the range sensor.

16. A control module comprising:
a chassis defining a first cavity and a second cavity;
a first circuit board assembly mounted to the chassis and disposed within the first cavity, the first circuit board assembly comprising electronics that generate heat during operation;
a first cold plate mounted to the chassis to enclose the first circuit board assembly within the first cavity, the first cold plate defines a first manifold in thermal communication with the first circuit board assembly to transfer the heat;
a second circuit board assembly mounted to the chassis and disposed within the second cavity, the second circuit board assembly comprising at least two high-performance processors that generate heat during operation;
a second cold plate mounted to the chassis adjacent to the second circuit board assembly within the second cavity, the second cold plate defining at least two openings, each opening being aligned with one of the at least two high-performance processors; and
at least two cold blocks coupled to the second cold plate, each cold block being disposed within one opening of the at least two openings and defining a chamber for receiving a liquid and facilitating impinging flow of the liquid through the chamber to absorb the heat from the aligned high-performance processor,
wherein the second cold plate defines a second manifold, the second manifold being configured to:
receive the liquid from each cold block;
transfer the heat generated by the second circuit board assembly to the liquid; and
provide the liquid to the first manifold.

17. The control module of claim 16, wherein each cold block of the at least two cold blocks comprises;
a base spring biased to engage the at least two high-performance processors;
a plurality of fins extending away from the base, the plurality of fins being spaced apart from each other to form channels therebetween; and
a plate spaced apart from the base to form the chamber, the plate defining an inlet arranged over a central portion of the plurality of fins to receive the liquid therethrough to facilitate the impinging flow of the liquid through the channels to absorb the heat transferred from the aligned high-performance processor.

18. The control module of claim 17, wherein each cold block further comprises:
at least one support extending from an outer portion of the plurality of fins to engage the plate and isolate the chamber from the inlet, wherein an inner surface of the plate is contoured to guide the liquid within the chamber toward an outlet formed in the cold block.

19. The control module of claim 16, wherein the at least two cold blocks are arranged in parallel with each other and configured to circulate the liquid through the at least two cold blocks at approximately equal pressure and speed.

20. A vehicle comprising:
the control module according to claim 16, wherein the circuit board assembly is configured to control at least one vehicle system.

* * * * *